United States Patent [19]

Hornak et al.

[11] 4,280,196

[45] Jul. 21, 1981

[54] CORRECTION OF ZERO DRIFT, GAIN DRIFT, AND DISTORTION ERRORS IN ANALOG STORAGE DEVICES

[75] Inventors: Thomas Hornak; John J. Corcoran, both of Portola Valley; Samuel H. Maslak, Palo Alto, all of Calif.

[73] Assignee: Hewlett-Packard Company, Palo Alto, Calif.

[21] Appl. No.: 94,007

[22] Filed: Nov. 14, 1979

[51] Int. Cl.$^3$ .................. G11C 27/02; G11C 19/28
[52] U.S. Cl. ............................ 365/45; 307/221 D; 340/347 CC
[58] Field of Search ............ 365/45, 49; 340/347 AD, 340/347 CC; 307/229, 238, 358, 359, 221 D

[56] References Cited

U.S. PATENT DOCUMENTS 4,152,606  5/1979  Hornak ......................... 307/221 D

*Primary Examiner*—Terrell W. Fears
*Attorney, Agent, or Firm*—Ronald E. Grubman

[57] ABSTRACT

A system is provided in which an analog storage device stores, delays, and/or changes the time scale of an input analog waveform. The system provides an output which is corrected for the gain and offset of the analog storage device by exercising the system using known analog inputs and combining the output so obtained with the uncorrected output of the input analog waveform. In a preferred embodiment, the output is also corrected for non-linear and dispersive distortion of the storage device by exercising the system using an input analog signal derived from the earlier output of the system (corrected for gain and offset) and suitably combining the new output so generated with the earlier output.

4 Claims, 1 Drawing Figure

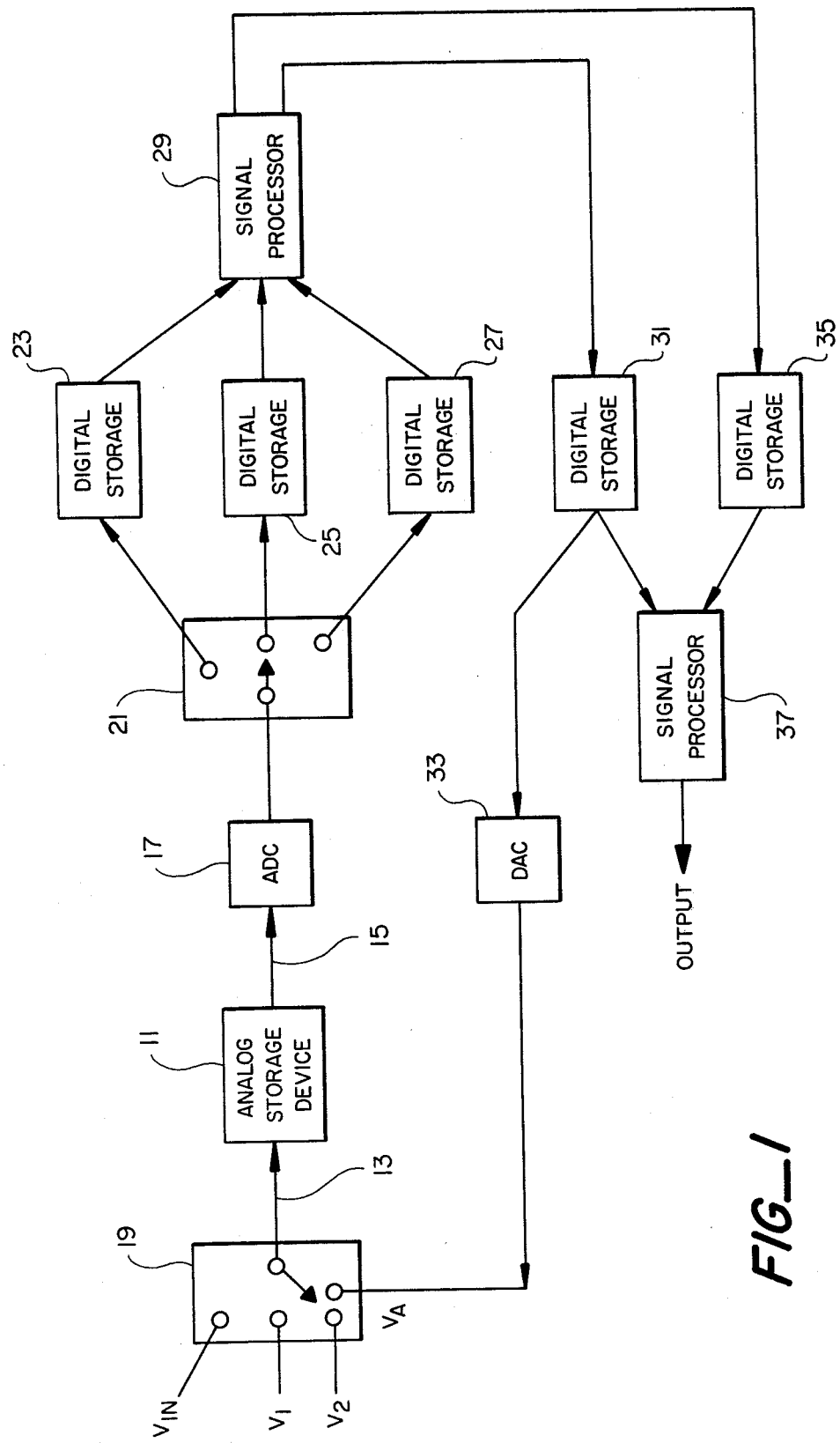
FIG_1

CORRECTION OF ZERO DRIFT, GAIN DRIFT, AND DISTORTION ERRORS IN ANALOG STORAGE DEVICES

BACKGROUND OF THE INVENTION

Analog storage devices are sometimes used for delaying and/or for changing the time scale of analog waveforms. For example, a storage device used to "time stretch" an analog waveform is disclosed in U.S. Pat. No. 4,152,606, "Waveform Capture Device" issued May 1, 1979, and assigned to the present assignee. The delayed and/or time transformed output signal of these devices often differs from the desired "true" output signal by a significant d.c. offset, a significant change in voltage scale (i.e., a non-unity gain) and by distortion. All of these errors are typically dependent on temperature, power supply voltage, and life.

In some devices (such as the above-mentioned "Waveform Capture Device") operation is based on sampling of the input signal, each sample being stored in a different part ("bin") of the device. In this case, the offset, gain, and distortion errors can be different from bin to bin, thus superimposing a systematic noise on the desired output signal.

SUMMARY OF THE INVENTION

In accordance with the illustrated preferred embodiments, a system is provided in which an analog storage device stores, delays, and/or changes the time scale of an input analog waveform. The system provides an output which is corrected for the gain and offset of the analog storage device by exercising the system using known analog inputs and combining the output so obtained with the uncorrected output of the input analog waveform. In a preferred embodiment, the output is also corrected for non-linear and dispersive distortion of the storage device by exercising the system using an input analog signal derived from the earlier output of the system (corrected for gain and offset) and suitably combining the new output so generated with the earlier output.

DESCRIPTION OF THE DRAWING

FIG. 1 shows systems in which the output of an analog storage device is corrected for gain, offset, and distortion errors.

DETAILED DESCRIPTION OF THE INVENTION

In FIG. 1, there is shown an analog storage device 11, such as the Waveform Capture Device described in U.S. Pat. No. 4,152,606, or the SAM-64 Serial Analog Memory manufactured by Reticon Corporation. Analog signals representing a "time window" of a signal to be stored, delayed, or time stretched are inputted to device 11 on an input line 13, and are outputted on an output line 15, having been delayed (or time stretched) in device 11, as desired. Signals outputted on line 15 are converted to digital words by an analog-to-digital converter (ADC) 17 which outputs digital words representing successive samples of the analog signal. ADC converter 17 is preferably of the low cost successive approximation type, with conversion rate compatible with the output rate of device 11.

Correction of offset and gain errors is accomplished as follows: an analog input signal $V_{IN}$ is directed to storage device 11 by an analog multiplexer 19, which may be configured from a pair of DG-141 integrated circuits available from Siliconix Corp. In general, the device will "sample" the analog waveform to produce a sequence of voltages $(V_{IN})_i$, $i = 1, 2, 3, \ldots$ (max), each of which will be stored in a separate location in storage device 11. However, to simplify the discussion, the subscript "i" will be omitted, it being understood that $V_{IN}$ (and all associated digital and analog functions) may represent voltages "sampled" from a waveform. After suitable delay, or at a different speed (depending on the purpose of the storage device), the stored analog signal is read into ADC 17 where it is converted to a digital word $B_{IN}$. A digital multiplexer 21 directs digital word $B_{IN}$ to a first digital storage device 23, where $B_{IN}$ is stored for subsequent use. Digital storage device 23, as well as all other digital storage devices discussed herein, may be of the shift register or random access memory type. In practice, if the storage devices are digitally addressable, the data output from ADC 17 may be put on a data bus, and directed to the proper storage device by a system controller, such as a 6800 microprocessor available from Motorola.

At this point, analog multiplexer 19 is switched into a second position to connect the input of storage device 11 to the source of a known constant d.c. voltage $V_1$. Voltage $V_1$ is now written into storage device 11 while maintaining the same operational conditions of storage device 11 as during write-in of $V_{IN}$. The readout and analog-to-digital conversion procedure is now repeated to produce a corresponding digital word $B_1$ stored in digital storage 25 via digital multiplexer 21. After the write-in of $V_1$ has been completed, analog multiplexer 19 is switched into a third position and a second known constant d.c. voltage $V_2$ ($V_2 \neq V_1$) is written into the storage device 11, still maintaining identical operating conditions. A digital word $B_2$ resulting from read-out and analog-to-digital conversion of $V_2$ is now stored in a digital storage device 27.

As the next step of the error correction procedure, the digital words $B_{IN}$, $B_1$, and $B_2$ stored in digital storage 23, 25, and 27 are simultaneously read out into a signal processor 29 which combines the digital words $B_{IN}$, $B_1$, and $B_2$ into a digital word $W_{IN}$ according to the expression $$W_{IN} = \frac{(W_1 - W_2)}{(B_1 - B_2)} \times \left[ B_{IN} - \frac{(B_1 + B_2)}{2} \right] + \frac{W_1 + W_2}{2} \quad (1)$$

In this expression, $W_1$ and $W_2$ are digital representations of voltages $V_1$ and $V_2$, respectively, which are loaded into processor 29 prior to the operation producing digital word $W_{IN}$. Processor 29 is preferably a digital processor such as a 6800 microprocessor from Motorola or a 2900 microprocessor system available from AMD Corp., which is easily programmable by those skilled in the art to linearly combine digital words $B_{IN}$, $B_1$, $B_2$, $W_1$, and $W_2$ to yield $W_{IN}$, which, in turn, is stored in another digital storage device 31. Processing according to expression (1) represents a straight line fit of the storage device's transfer function. The term $(W_1 - W_2)/(B_1 - B_2)$ corrects the gain error, while the terms $B_{IN} - (\frac{1}{2}) \cdot (B_1 + B_2)$ and $(\frac{1}{2}) \cdot (W_1 + W_2)$ corrects the d.c. offset. It is also possible t achieve the gain and offset corrections using linear expressions other than equation (1). For example, processor 29 may be programmed to produce $W_{IN}$ from the expression $$W_{IN} = \frac{(W_1 - W_2)}{(B_1 - B_2)} \times [B_{IN} - B_j] + W_j, \quad (2)$$

where $B_j = B_1$ and $W_j = W_1$ or $B_j = B_2$ and $W_j = W_2$. In general, the requirement is to produce a digital word $W_{IN}$ which represents $V_{IN}$ without gain or offset error, when the gain and offset errors of the system are such that $B_{IN} = \alpha V_{IN} + k$, where $\alpha$ and $k$ are constants representing the system gain and offset, respectively.

Since equation (1) is a linear correction, digital word $W_{IN}$ will not represent an accurate reconstruction of the analog input voltage $V_{IN}$ if the analog storage device exhibits a non-linear static transfer function. In such a case, the straight line fit will produce an error-free representation by words $W_{IN}$ only of samples of $V_{IN}$ equal or close to voltage levels $V_1$ and $V_2$. Samples of $V_{IN}$ which differ greatly from $V_1$ or $V_2$ will be represented by words $W_{IN}$ with an error dependent on the static non-linearity of the function of storage device 11. To minimize such errors with a device exhibiting, for example, a second order static non-linearity, $V_1$ and $V_2$ should be selected according to the relationship $$V_{1,2} = \frac{(V_{IN})_{max} + (V_{IN})_{min}}{2} \pm q \cdot [(V_{IN})_{max} - (V_{IN})_{min}] \quad (3)$$

where $(V_{IN})_{max}$ and $(V_{IN})_{min}$ represent the endpoints of the range $V_{IN}$ and where $$q = \frac{1}{2\sqrt{2}}.$$

If analog storage device 11 exhibits a non-linear static transfer function, and/or dispersive distortion, further error reducing procedures may be applied as follows:

Words, $W_{IN}$, in addition to being stored in digital storage 31, are also fed into a digital-to-analog converter (DAC) 33, such as model number AD562 available from Analog Devices Corp., to be converted into a corresponding analog voltage $V_{DA}$. (Alternatively, DAC 33 may be connected to the input of digital storage device 31.) $V_{DA}$ is now written into analog storage device 11 via a fourth position of multiplexer 19 and is read out, digitized, and stored again in digital storage device 23 in the form of digital words $B_{DA}$. This operation is similar to the previous write-in of analog $V_{IN}$, except that a different write-in speed may be dictated by the speed limitations of DAC 33. If the gain and offset errors of storage device 11 are write-in speed dependent, a second write-in, read-out, and digitization of voltages $V_1$ and $V_2$ must take place at a write-in speed identical with the write-in speed of $V_{DA}$. The resulting digital words $(B_1)_{DA}$ and $(B_2)_{DA}$ are again stored in digital storage devices 25 and 27, respectively. Otherwise, a second write-in, read-out, and conversion of $V_1$ and $V_2$ is not necessary and the words $B_1$ and $B_2$ previously stored in digital storage devices 25 and 27 can be used directly as $(B_1)_{DA}$ and $(B_2)_{DA}$ in the following calculation of a new digital word $W_{DA}$:

$$W_{DA} = \frac{W_1 - W_2}{(B_1)_{DA} - (B_2)_{DA}} \times \left[ B_{DA} - \frac{(B_1)_{DA} + (B_2)_{DA}}{2} \right] + \frac{W_1 + W_2}{2}. \quad (4)$$

Digital word $W_{DA}$ is now stored in another digital storage device 35.

Digital word $W_{IN}$ previously stored in digital storage device 31 represents a digitized representation of $V_{IN}$ corrected for the offset and gain errors of storage device 11 by a straight line fit of the device's transfer function. Digital word $W_{DA}$ stored in digital storage device 35 represents a similarly corrected digitized sample of $V_{DA}$. However, dispersive and non-linear distortion in storage device 11 (not corrected by the straight line fit) creates a difference between the true value of $V_{IN}$ and the respective digital word $W_{IN}$, as well as a difference between the true value of $V_{DA}$ and the respective digital word $W_{DA}$. However, the true value of $V_{DA}$ is known; it equals the translation of the digital word $W_{IN}$ into analog form by DAC 33 which is assumed to have negligible errors. The distortion imposed by the analog storage device 11 on the voltage $V_{DA}$ can therefore be determined by comparing the corresponding words $W_{IN}$ and $W_{DA}$ stored in digital storage devices 31 and 35, respectively. In particular, with offset and gain errors removed by a straight line fit, $V_{DA}$ differs from $V_{IN}$ only by the analog storage device's distortion or dispersion products. Assuming that these products are relatively small but not negligible (for example, a few percent of the range of $V_{IN}$), the signals $V_{IN}$ and $V_{DA}$ will differ only slightly. The distortion products resulting from passage of $V_{DA}$ will be almost identical to the distortion products generated by the passage of $V_{IN}$ through the analog storage device, both signals exercising the device almost identically. (In case of a write-in rate difference between $V_{IN}$ and $V_{DA}$, this applies only to the speed independent distortion products.) This amounts to the following:

$$T(V_{IN}) - W_{IN} = \Delta, \quad (5)$$

$$T(V_{DA}) - W_{DA} = \Delta \quad (6)$$

where
$T(V_{IN}) \equiv$ the true value of $V_{IN}$, stated in digital form,
$W_{IN} \equiv$ digitized value of $V_{IN}$, corrected for gain and offset only,
$T(V_{DA}) \equiv$ the true value of $V_{DA}$, stated in digital form,
$W_{DA} \equiv$ digitized value of $V_{DA}$, corrected for gain and offset only, and
$\Delta \equiv$ error due to distortion.

Combining equations (5) and (6) yields $$T(V_{IN}) = W_{IN} + T(V_{DA}) - W_{DA}. \quad (7)$$

Recalling now that $V_{DA}$ is simply an analog voltage converted from the digital word $W_{IN}$, it is apparent that $$T(V_{DA}) = W_{IN} \quad (8)$$

which can be substituted into equation (7) to yield $$T(V_{IN}) = W_{IN} + (W_{IN} - W_{DA}). \quad (9)$$

Defining $W_{OUT} \equiv T(V_{IN})$, equation (9) reads $$W_{OUT} = 2W_{IN} - W_{DA}. \quad (10)$$

This subtraction is performed by a signal processor 37 into which the corresponding words $W_{IN}$ and $W_{DA}$ are read out simultaneously from digital storage devices 31 and 35, respectively. The virtually error-free words $W_{OUT}$ can be utilized either in digital form or after another digital-to-analog conversion, as an analog signal.

The above-described procedure removes offset and gain errors completely and reduces a distortion product ratio of "p" to "p²" (for example, from p=1% to p=0.01%). Should this be insufficient, an additional iteration can be performed. This would, for example, include converting words $W_{OUT}$ into a new analog voltage, transferring this voltage through the analog storage device with offset and gain error correction procedures previously described, and generating a new digital word $W''_{DA}$. By comparing digital words $W_{OUT}$ and $W''_{DA}$, the device distortion from the passage of the new analog voltage through the device could be determined and used to correct $W_{IN}$ so that a more perfect cancellation of distortion products can be achieved. In principle, the number of iterations can be increased without limit. However, a point of diminishing return would soon be reached, since other errors (mainly those introduced by DAC 33 and system noise) would become cumulative and overriding.

We claim:

1. A device for storing an input analog waveform and producing an output signal representing the input signal, said device comprising:
   analog storage means for storing an input analog waveform;
   input means for operating in a signal mode to input into said analog storage means, said input waveform to be stored, operating in a first reference mode to input a first reference waveform into said analog storage means, and operating in a second reference mode to input a second reference waveform into said analog storage means;
   ADC means for converting the output of said analog storage means into a digital word;
   first digital storage means for storing a signal digital word resulting from operation of said analog storage means and ADC means on said input analog waveform, a first reference digital word resulting from operation of said analog storage means and ADC means on said first reference waveform, and a second digital word resulting from operation of said analog storage means and ADC means on said second reference waveform;
   first signal processing means for combining said signal digital word and said first and second reference digital words to produce a once-corrected digital word representing said input analog waveform corrected for gain and offset errors of said analog storage means.

2. A device as in claim 1 wherein said first signal processing means combines said digital words according to the relationship $$W_{IN} = \frac{(W_1 - W_2)}{(B_1 - B_2)} \times \left[ B_{IN} - \frac{(B_1 + B_2)}{2} \right] + \frac{W_1 + W_2}{2}$$

where
$B_{IN}$≡said signal digital word,
$B_1$≡said first reference digital word,
$B_2$≡said second reference digital word,
$W_1$≡a digital word representing said first reference waveform,
$W_2$≡a digital word representing said second reference waveform,
$W_{IN}$≡said once-corrected digital word.

3. A device as in claims 1 or 2 wherein said input means operates in a third reference mode to input a corrected analog signal to said analog storage means, said device further comprising:
   second digital storage means for storing said once-corrected digital word;
   DAC means for converting said once-corrected digital word into said corrected analog signal;
   third digital storage means for storing a twice-corrected digital word resulting from operation of said analog storage means, said ADC means, said first digital storage means, said signal processing means, and said DAC means on said corrected analog signal; and
   second signal processing means for combining said once-corrected digital word with said twice-corrected digital word to produce an output word representing said input analog waveform corrected for gain, offset, non-linear distortion and dispersion errors of said analog storage means.

4. A device as in claim 3 wherein said second signal processing means combines said once-corrected digital word and said twice-corrected digital word according to the relationship $$W_{OUT} = 2W_{IN} - W_{DA}$$

where
$W_{IN}$≡said once-corrected digital word,
$W_{DA}$≡said twice-corrected digital word, and
$W_{OUT}$≡said output word.

* * * * *